United States Patent [19]

Fohrenkamm et al.

[11] Patent Number: 5,364,740
[45] Date of Patent: Nov. 15, 1994

[54] BLEACHING OF DYES IN PHOTOSENSITIVE SYSTEMS

[75] Inventors: Elsie A. Fohrenkamm, St. Paul, Minn.; James F. Sanders, Houlton, Wis.

[73] Assignee: Minnesota Mining and Manufacturing Company, St. Paul, Minn.

[21] Appl. No.: 150,237

[22] Filed: Nov. 9, 1993

Related U.S. Application Data

[63] Continuation of Ser. No. 998,443, Dec. 30, 1992, abandoned.

[51] Int. Cl.$^5$ .................. G03F 7/029; G03F 7/031
[52] U.S. Cl. .................. 430/294; 430/293; 430/325; 430/324; 430/330
[58] Field of Search .......... 430/337, 339, 344, 293, 430/325, 326, 328, 330, 281, 294

[56] References Cited

U.S. PATENT DOCUMENTS

| | | | |
|---|---|---|---|
| 2,714,066 | 7/1955 | Jewett et al. | 430/155 |
| 3,658,521 | 4/1972 | Contois | 430/73 |
| 3,729,313 | 4/1973 | Smith | 430/332 |
| 3,788,849 | 1/1974 | Taguchi et al. | 430/336 |
| 3,925,077 | 12/1975 | Lewis et al. | 430/325 |
| 4,228,232 | 10/1980 | Rousseau | 430/271 |
| 4,304,923 | 12/1981 | Rousseau | |
| 4,460,677 | 7/1984 | Smith et al. | 430/336 |
| 4,548,896 | 10/1985 | Sabungi et al. | 430/332 |
| 4,587,198 | 5/1986 | Fisch | 430/201 |
| 4,594,312 | 6/1986 | Sabongi et al. | 430/339 |
| 4,632,895 | 12/1986 | Patel et al. | 430/201 |
| 4,685,783 | 8/1987 | Heller et al. | 351/163 |
| 4,701,402 | 10/1987 | Patel et al. | 430/332 |
| 4,710,445 | 12/1987 | Sanders | 430/252 |
| 4,746,595 | 5/1988 | Sanders | 430/271 |
| 4,755,450 | 7/1988 | Sanders et al. | 430/285 |
| 4,876,175 | 10/1989 | Chen et al. | 430/281 |
| 4,933,452 | 6/1990 | White et al. | 544/204 |
| 5,153,104 | 10/1992 | Rossman et al. | 430/339 |
| 5,180,652 | 1/1993 | Yamaguchi et al. | 430/281 |

FOREIGN PATENT DOCUMENTS 0424124 10/1990 European Pat. Off.
0462704 5/1991 European Pat. Off.

*Primary Examiner*—Charles L. Bowers, Jr.
*Assistant Examiner*—John A. McPherson
*Attorney, Agent, or Firm*—Gary L. Griswold; Walter N. Kirn; Gregory A. Evearitt

[57] ABSTRACT

A process for producing an imaged article with little or no residual dye stain and with a colored image involving the steps of:
(a) exposing a positive- or negative-acting photoresist to radiation having a wavelength in the range of from about 300 to 1100 nm, the photoresist containing:
  (i) a photosensitive composition; and
  (ii) a dye, capable of sensitizing a photolyzable organic halogen compound, in reactive association with an aromatic iodonium salt or halogenated triazine compound,
  thereby forming an image in the exposed or unexposed areas of the photoresist;
(b) developing the image resulting from step (a); and
(c) bleaching the remaining sensitizing dye in the photoresist by simultaneously heating and exposing the sensitizing dye and aromatic iodonium salt or halogenated triazine compound to radiation having a wavelength in the range of about 300 to about 700 nm at a temperature of at least about 40° C.

Optionally, the remaining sensitizing dye in the photoresist of step (b) can be brought into further reactive association with additional aromatic iodonium salt or halogenated triazine compound before or concurrently with the second exposure step involving the simultaneous application of heat and light.

22 Claims, No Drawings

BLEACHING OF DYES IN PHOTOSENSITIVE SYSTEMS

This is a continuation of application Ser. No. 07/998,443 filed Dec. 30, 1992, now abandoned.

BACKGROUND TO THE INVENTION

1. Field of the Invention

This invention relates to a process for producing an imaged article and in particular it relates to such a process whereby sensitizing dye is bleached by the simultaneous exposure to heat and radiation.

2. Background of the Invention

It is well known in the imaging arts that photolyzable organic halogen compounds, such as diaryliodonium salts and triarylsulfonium salts (e.g., "onium" salts) and halogenated triazines, can be sensitized with a variety of dyes (e.g., diphenylmethane, xanthene, aminoketones, etc.) in imaging systems involving polymerization of negative-acting, free-radically polymerizable monomers. See, for example, U.S. Pat. No. 3,729,313. Additionally, such photosensitive compositions can be employed in positive-acting imaging systems, whereby, for example, a polymer which has been rendered insoluble by the presence of a solubility inhibitor is solubilized upon the exposure of a combination of sensitizing dye and diaryliodonium salt or halogenated triazine to radiation.

Such sensitizers also sometimes function as anti-halation or acutance dyes. As is known in the imaging arts, such dyes serve to absorb incidental or scattered light in light-sensitive imaging layers. By absorbing the scattered light, a reduction in image sharpness is avoided.

Regardless of the function of the dye, it will often be necessary to bleach any remaining dye after an image is formed because residual dye color can be objectionable. Dye bleaching is well known in the art and typically involves the use of heat or light or combinations thereof.

U.S. Pat. No. 3,658,521 discloses the simultaneous use of light and heat to bleach 1-aminopyridinium dyes which are useful for sensitizing photoconductive compositions used in electrophotographic layers. Bleaching of the dye eliminatels undesirable color imparted to background areas of an image-bearing element, thereby increasing the visual contrast of the bleached element. The bleaching of dyes in conjunction with either aromatic iodonium or halogenated triazine compounds is not disclosed.

U.S. Pat. No. 3,788,849 discloses a process for forming visible images by exposing a thin film of a dye (e.g., diphenylmethane, triarylmethane, acridine, and xanthene dyes) having an absorption in the visible wavelength region to light which will be absorbed by the dye and heating the thin film simultaneously, or immediately after the exposure, whereby the dye is faded in the areas which have not been exposed to light. The use of aromatic iodonium salts or halogenated triazine compounds are not disclosed.

U.S. Pat. No. 4,548,896 discloses an imagewise bleachable composition containing a dye in reactive association with a mesoionic compound. The composition may be bleached upon exposure to radiation having a wavelength in the range of about 200 to 1100 nm and/or upon heating to at least 70° C. Aromatic iodonium salts and halogenated triazines are not disclosed.

U.S. Pat. No. 4,594,312 discloses heat-bleachable polymethine dyes used as acutance/antihalation dyes in dry silver materials. The use of aromatic iodonium salts or halogenated triazine photoinitiators is not disclosed.

U.S. Pat. No. 4,632,895 discloses the formation of a positive dye image by bleaching of a dye with iodonium ion. The iodonium ion is exposed to radiation in order to initiate the bleaching process.

U.S. Pat. No. 4,701,402 discloses a radiation-sensitive element capable of recording an image upon image-wise exposure to radiation of selected wavelength. The element contains an effective amount of a bleachable dye in reactive association with an iodonium ion as the image-forming components. Suitable dyes include polyroethine dyes having an oxidation potential between 0 and ±1 volt.

European Patent Office Publication No. 424,124 discloses a positive-acting photoresist composition containing: (i) an alkali-soluble binder having a plurality of phenol groups; (ii) a diaryl iodonium salt; and (iii) an acid cleavable compound. A sensitizer for the diaryl iodonium salt is also disclosed.

Light-sensitive articles have been employed in the preparation of overlay or surprint color proofing sheets, which are used to verify the accuracy, with respect to color, of separation films used in the preparation of printing plates. A single-sheet, four color proof (a surprint) must duplicate with great accuracy the colored image and background to be achieved on a printing press using printing plates made with the same separation films. Such articles are well known in the graphic arts and typically comprise a photoreaction initiator, a photoreactive (polymerizable or depolymerizable) compound, a photoreaction initiator, a sensitizing dye for the photoreaction initiator, and a pigment. Processes and methods of color proofing are described in M. H. Bruno, Principles Of Color Proofing: Gama Communications; Salem, N.H.; 1986.

The purpose of the photoreaction initiator (i.e., photoinitiator) is to generate free radicals upon imagewise exposure of the photoreactive layer to actinic radiation to initiate polymerization (or depolymeization). The sensitizing dye serves to sensitize the photoinitiator to the radiation of the light sources used. The pigment is a colored material that very closely matches the color of the inks that will be used in printing. Thus, the final color of the pigment is the desired final color of the proof.

One common method of developing such an image uses the solubility difference created between the photoreacted and unphotoreacted material. For example, the photoreacted material may be less soluble in the exposed regions and more soluble in the unexposed regions. Removal of the soluble material with an appropriate solvent results in an image of photoreacted material in the exposed regions.

Another common method of developing such an image uses a laminate construction. The material in the exposed region preferentially adheres to one of the layers in the laminate and can be separated from the material in the unexposed region by peeling the laminate apart. A general review of photopolymerization and development techniques is described in C. G. Roffey, *Photopolymerization of Surface Coatings*; John Wiley & Sons; New York, N.Y.; Chapters 4 and 6, 1982.

Whenever a layer of a photoreactive material that is a component of a proofing sheet construction comes into contact with a layer of resin (such as is present in a laminate peel-apart construction) it is possible for one or more of the colored components of the photoreactive layer, in addition to the pigment, to migrate into the layer of the laminate and cause discoloration of the transferred pigment. An "off-color" proof then results.

U.S. Pat. No. 4,933,452 discloses triazine derivatives of polymeric or oligomeric compounds having a reduced tendancy for migration. However, these triazine compounds require a sensitizing dye be incorporated into the photoreactive construction in order for the photoinitiator to be responsive to the radiation of the light sources used in graphic arts applications. This sensitizing dye can migrate into the laminating layer and cause discoloration of the subsequent proof. Unless this sensitizing dye can be bleached after imaging or after transfer to the proof, an "off-color" proof can result.

In a typical imaging construction employing sensitizing dyes for iodonium salts and halogenated triazines, generally at least about ten percent of the actinic light to which the construction is exposed will be absorbed by the dye in the wavelength range of about 400 to 600 nm. In such constructions one would expect the need to use an exposure fluence (i.e., average exposure of radiant energy per unit area expressed in Joules/cm$^2$) of visible light energy on the order of 20 to 200 J/cm$^2$ to render a bleachable dye colorless or subject to no further color change in a commercially practical period of time. However, in order to prevent thermal damage to substrates such as paper or films typically used in photographic constructions, it is generally necessary to use fluence rates of less than about 3 J/cm$^2$/min. Thus, typical bleach exposures will require from about 5 to about 60 minutes of exposure. This is impractical for most product applications. It would be desirable to have an imaging process whereby effective image formation occurs, yet relatively low radiation fluence and dye bleach exposure rates are employed.

SUMMARY OF THE INVENTION

In accordance with the present invention it has now been discovered that through the simultaneous application of radiation and heat, surprising low radiation exposure fluence rates and heating (time and temperature) conditions are required to bleach certain sensitizing dyes which have been employed in a prior imaging step wherein the sensitizing dyes have been in reactive association with an aromatic iodonium salt or halogenated triazine compound. It is surprising that effective post-imaging dye bleaching occurs under the application of relatively low radiation exposure fluence rams and heating parameters in view of the fact that the prior imaging step would have been expected to considerably lower the concentration of either undissociated or dissociated aromatic iodonium salt or halogenated triazine compound necessary to effectively participate in bleaching of the dye upon subsequent exposure to heat and radiation.

In one embodiment, the present invention provides a process for producing an imaged article with little residual dye stain and which is color stable comprising the steps of:
 (a) exposing a positive- or negative-acting photoresist to radiation having a wavelength in the range of about 300 to 1100 nm, the photoresist comprising:
  (i) a photosensitive composition; and
  (ii) a dye, capable of sensitizing a photolyzable organic halogen compound, in reactive association with an aromatic iodonium salt or halogenated triazine compound,
 thereby forming an image in the exposed or unexposed areas of the photoresist;
 (b) subtractively developing the image resulting from step (a); and
 (c) bleaching the remaining sensitizing dye in the photoresist by simultaneously heating and exposing the sensitizing dye and aromatic iodonium salt or halogenated triazine compound to radiation having a wavelength in the range of from about 300 to about 700 nm at a temperature of at least about 40° C.

In another embodiment, the present invention provides a process for producing an imaged article with little residual dye stain and which is color stable comprising the steps of:
 (a) exposing a positive- or negative-acting photoresist to radiation having a wavelength in the range of about 300 to 1100 nm, the photoresist comprising:
  (i) a photosensitive composition; and
  (ii) a dye capable of sensitizing a photolyzable organic halogen compound, in reactive association with an aromatic iodonium salt or a halogenated triazine compound,
 thereby forming an image in the exposed or unexposed areas of the photoresist;
 (b) subtractively developing the image resulting from step (a);
 (c) bringing the remaining sensitizing dye in the photoresist from step (b) into reactive association with additional aromatic iodonium salt or halogenated triazine compound; and
 (d) bleaching the remaining sensitizing dye in the photoresist by simultaneously heating and exposing the sensitizing dye and aromatic iodonium salt or halogenated triazine compound to radiation having a wavelength in the range of from about 300 to 700 nm at a temperature of at least about 40° C.

Step (c) can either immediately precede step (d) or can occur simultaneously therewith.

In a preferred embodiment, the first exposure step utilizes radiation having a wavelength in the range of from about 300 to 800 nm. Preferably, the second exposure utilizes radiation having a wavelength in the range of from about 300 to 500 nm. Preferably, the second radiation exposure step utilizes a fluence of from about 0.5 to 1.0 J/cm$^2$, and more preferably is about 1.0 J/cm$^2$. As used herein, the term "fluence" refers to average exposure of radiant energy per unit area, typically expressed in Joules/cm$^2$. Additionally, heating in the final step with simultaneous exposure of sensitizing dye to radiation is preferably conducted at a temperature in the range of about 40° to 150° C., and more preferably in the range of about 60° to 100° C. Preferably, the time for heating is about 0.5–10 minutes, more preferably about 1–3 minutes.

Preferably, the weight ratio of sensitizing dye to aromatic iodonium or halogenated triazine compound in the first radiation exposure step is in the range of about 1:1 to 1:50 and more preferably is in the range of about 1:2 to 1:10.

The inventive process offers numerous advantages over conventional imaging processes which involve dye bleaching. Relatively lower dye bleach radiation exposure rates (J/cm$^2$/sec) and heating conditions (time and temperature) are required. Additionally, thermal damage to conventional photographic substrates such as paper or films is either greatly reduced or eliminated. Effective dye bleaching occurs such that a high quality image without objectionable residual dye stain is produced. Also, a stable color image is formed.

Other aspects, advantages, and benefits of the present invention are apparent form the detailed description, examples, and claims.

DETAILED DESCRIPTION OF THE INVENTION

The photoresist used in the present invention can be any positive- or negative-acting photoresist known in the art. Negative-acting photoresists comprise photosensitive compositions which undergo photochemically-induced polymerization or crosslinking in light-exposed regions, thereby becoming insoluble in developer solutions. Non-limiting examples of photosensitive compositions used in negative-acting photoresists are aromatic diazonium salts and ethylenically unsaturated, free-radically polymerizable monomers such as acrylic esters, methacrylic esters, and acrylamides.

Positive-acting photoresists comprise photosensitive compositions which undergo photochemically-induced decomposition or rearrangement in light exposed regions, thereby becoming soluble in developer solutions. Non-limiting examples of positive-acting systems include diazo-quinone/novolak resins; polymers containing acid-sensitive pendant alkoxyalkyl ester groups; etc.

Any dye capable of sensitizing a photolyzable organic halogen compound, such as 2-methyl-4,6-bis(trichloromethyl)-s-triazine, can be used in the present invention. Non-limiting classes of such dyes include diphenylmethane, xanthene, acridine, methine, polymethine, thiazole, thiazine, azine, aminoketone, porphyrin, colored aromatic polycyclic hydrocarbons, p-(substitutedamino)styryl dyes and aminotriarylmethanes.

To determine whether a particular dye is a suitable sensitizer for use in the present invention, the following test procedure may be employed. A standard test solution is prepared with the following composition:

A methanolic solution of 5.0 parts of a 5% (weight by volume) of Butvar TM B-76 poly(vinylbutyral); 0.3 parts of trimethylolpropane trimethacrylate; and 0.03 parts of 2-methyl-4,6-bis(trichloromethyl)-s-triazine is prepared. "Butvar B-76" is a polyvinylbutyral resin having a molecular weight of 45,000–55,000, a hydroxyl content of 9.0–13.0%, and is sold by Monsanto Chemical Company, St. Louis, Mo. For the preparation of 2-methyl-4,6-bis(trichloromethyl)-s-triazine see *Bull. Chem. Soc. Japan*, 1969, 42, pp. 2924–2930.

To this solution is added 0.01 part of the material to be tested as a sensitizer. The solution is knife coated onto a 2 mil (50 μm) clear polyester film using a knife orifice of 2.0 mil (50 μm), and the coating is air dried for about 30 minutes. Another 2 mil (50 μm) clear polyester cover-film is carefully placed over the dried but soft and tacky coating with minimum entrapment of air. The sandwich construction is then exposed for three minutes to 15,000 foot candles of incident light from a tungsten light source providing light in both the visible and ultraviolet range (General Electric 650 watt FCH quartz-iodine lamp).

Exposure is made through a stencil (e.g., template or mask) so as to provide exposed and unexposed areas in the construction. After exposure the cover-film is removed, and the coating is treated with a finely divided colored powder, such as a colored toner powder of the type conventionally used in xerography. If the tested material is a sensitizer, the trimethylolpropane trimethacrylate monomer in the light-exposed areas will have been polymerized by the light generated free radicals from the photolyzable organic halogen compound, i.e., the 2-methyl-4,6-bis(trichloromethyl)-s-triazine. The colored powder will selectively adhere only to the tacky, unexposed areas of the coating, thus providing a visual image corresponding to that in the stencil. In the polymerized, essentially tack-free, areas, no color toner powder will adhere.

Any diaromatic iodonium salt or halogenated triazine can be used in the present invention.

Preferably the diaromatic iodonium salt is one selected from the group consisting of:
wherein:

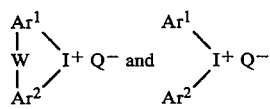

$Ar^1$ and $Ar^2$ are aromatic groups having from 4 to 20 carbon atoms;

W is selected from the group consisting of: a single bond;

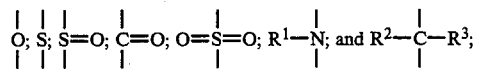

$R^1$ is aryl of 6 to 20 carbon atoms and $R^2$ and $R^3$ are individually hydrogen or alkyl groups of 1 to 4 carbon atoms; and $Q^-$ is an anion.

Preferably, the halogenated triazine is represented by the following formula:

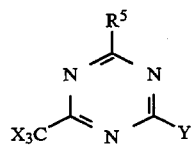

wherein:

X is chlorine or bromine;

Y is $-CX_3$; $-NH_2$; $-NHR^4$; $-N(R^4)_2$; or $-OR^4$ wherein $R^4$ is an alkyl group of 1 to 4 carbon atoms or an aryl group of 6 to 10 carbon atoms; and $R^5$ is $-CX_3$; an alkyl group of 1 to 12 carbon atoms; an aryl group of 6 to 12 carbon atoms; an alkenyl group of 2 to 12 carbon atoms; or an aralkenyl group of 8 to 20 carbon atoms. The sensitizing dye and aromatic iodonium salt or halogenated triazine are in reactive association on a suitable support. "Reactive association" is defined as such physical proximity between the compounds as to enable a chemical reaction to take place between them upon exposure to light. In practice, the dye and aromatic. iodonium salt or halogenated triazine are in the same layer or in adjacent layers on the support.

Preferably, the weight ratio of bleachable, sensitizing dye to aromatic iodonium salt or halogenated triazine compound used in the first radiation exposure step of the inventive processes is in the range of from about 1:1 to 1:50, more preferably in the range from about 1:2 to 1:10.

The photosensitive composition, bleachable sensitizing dye, and aromatic iodonium salt or halogenated triazine compound may be applied to the support in a binder. Suitable binders are transparent to translucent, are generally colorless, and include natural polymers, e.g., gelatin, gum arabic, synthetic resins, polymers, and copolymers, e.g., poly(vinylacetals), cellulose esters, polyamides, polyacrylates, polymethacrylates, polyurethanes, polyepoxides, polycarbonates, polyvinylacetates, poly(vinylbutyral), poly(vinylalcohol), poly(vinylpyrrolidone), poly(vinylidenechloride), poly(4-vinyl-N-alkylpyridinium salts), and other film-forming media. The binders may range from thermoplastic to highly crosslinked, and may be coated from aqueous or organic solvents or emulsions.

Any suitable photographic support can be used in the present invention. Exemplary supports include materials such as paper, polyethylene-coated paper, polypropylene-paper, parchment, cloth, and the like; sheets and foils of metals such as aluminum, copper, magnesium, and zinc; glass and glass coated with metals such as chromium, chromium alloys, steel, silver, gold, and platinum; synthetic polymeric materials such as poly(alkylmethacrylates), e.g., poly(methylmethacrylate), polyesters, e.g., poly(ethyleneterephthalate), poly(vinylacetals), polyamides, e.g., nylon, cellulose acetate, cellulose acetate propionate, cellulose acetate butyrate, and the like. Transparent materials, especially poly(ethyleneterephthalate) are preferred.

A variety of conventional additives, such as surfactants, antioxidants, stabilizers, plasticizers, coating aids, etc., may be used to prepare the photoresists, used in the inventive process, to achieve benefit of their known properties.

In a preferred embodiment, the first radiation exposure step of the inventive process utilizes radiation having a wavelength in the range of from about 300 to 800 nm.

After the first radiation exposure step, the resulting image is subtractively developed by any means known to those of ordinary skill in the art, e.g., use of aqueous alkaline solutions such as aqueous sodium hydroxide, etc.; aqueous alcohol solutions, e.g., water and n-propanol (80/20 blend), and organic solutions (e.g., toluene/ethyl acetate, 50/50 blend). As used herein, the term "subtractive developing" means selectively removing (i.e., subtracting) a layer from either the exposed or unexposed areas of a photosensitive construction.

In one embodiment of the present invention, after subtractive image development, the remaining sensitizing dye in the photoresist can be brought into reactive association with additional aromatic iodonium salt or halogenated triazine compound. The additional aromatic iodonium salt or halogenated triazine compound can be brought into reactive association with the remaining sensitizing dye by any convenient method. Preferably, it is done by placing the aromatic iodonium salt or halogenated triazine compound into a layer adjacent to the layer containing the remaining sensitizing dye and then thermally diffusing the aromatic iodonium salt or halogenated triazine into the layer containing the remaining sensitizing dye. The addition of further aromatic iodonium salt or halogenated triazine to the remaining sensitizing dye can be done either preceding or concurrently with the bleaching/heating of the sensitizing dye. Typically, the concentration of additional aromatic iodonium salt or halogenated triazine compound to remaining sensitizing dye will be at least about a 1:1 molar ratio with the upper concentration dictated by physical constraints on the imaging system such as formation of a yellowish tint or haze due to an overloading of initiator. In any event, the remaining dye is bleached by simultaneously heating and exposing the sensitizing dye and aromatic iodonium salt or halogenated triazine compound to radiation having a wavelength in the range of from about 300 to about 700 nm at a temperature of at least about 40° C.

In a preferred embodiment, the second exposure step utilizes radiation having a wavelength in the range of from about 300 to 500 nm. Preferably, the radiation exposure fluence in the second exposure step is in the range of about 0.5 to 1.0 J/cm$^2$ and more preferably is about 1.0 J/cm$^2$. Additionally, heating is preferably conducted at a temperature in the range of about 40° to 150° C., and more preferably in the range of about 60° to 100° C. Preferably, the time for heating is about 0.5–10 minutes, more preferably about 1–3 minutes.

The inventive processes of the present invention may be used for various graphics applications, such as prepress color proof materials. Additionally, the inventive process can be utilized in the construction of printing plates and printed circuit boards.

The following non-limiting examples further illustrate the present invention.

EXAMPLES

Determination and Evaluation of Sample Color

In general, the colors of the samples used in the Examples were determined and evaluated using a Macbeth Color-Eye Spectrophotometer.

One method of color measurement is to determine the color's position in color space. One color space system is the CIE Color System. In this system three mutually perpendicular axes (L*, a*, and b*) are needed to define a color. "L*" (the +z axis) represents the color intensity; "a*" (the x axis) represents the amount of red or green (+a* is red, −a* is green); and "b*" (y axis) represents the amount of yellow or blue (+b* is yellow, −b* is blue). By measuring a material's L*, a*, and b* values, the color of one sample can be compared with that of other samples. The difference between any two colors in three dimensional space is given by $\Delta E^*$, where the equation for determining $\Delta E^*$ is shown below.

$$\Delta E^* = [(L_2^* - L_1^*)^2 + (a_2^* - a_1^*)^2 + (b_2^* - b_1^*)^2]^{\frac{1}{2}}$$

Because the color of a sample is also dependent upon the color temperature of the illuminating source, the angle at which the sample is illuminated, the angle at which the illumination is reflected, and the angle of the retina illuminated, these all need to be specified. Many instruments have been developed to record these values. One such instrument is the Macbeth Color-Eye Spectrophotometer (available from the Macbeth Division of Kollmorgen Instruments, Newburgh, N.Y.). This instrument is capable of automatically determining the L*, a*, and b* values for a given sample, and was used for the following examples. For a discussion of L*a*b* color notation, CIE color space, and $\Delta E^*$ see R. W. G. Hunt, *Measuring Color*, John Wiley & Sons; New York, N.Y.; 1987 and F. W. Billmeyer, Jr., and M. Saltzman, *Principles of Color Technology*; John Wiley & Sons; New York, N.Y.; Ch. 2 & 3, 1981.

Examples 1–3

Examples 1–3 demonstrate the effect of simultaneous exposure to light while heating. The following photosensitive solutions were prepared.

| Material | Ex. 1 | Ex. 2 | Ex. 3 |
|---|---|---|---|
| Elvacite ® 2010 (E. I. DuPont Co.) | 10.0 g | 10.0 g | 10.0 g |
| 2-Butanone | 45.0 g | 45.0 g | 45.0 g |
| Cyclohexanone | 45.0 g | 45.0 g | 45.0 g |
| Coumarin Sensitizer | 0.05 g | | |
| DMBA Sensitizer | | 0.05 g | |
| Thioflavin-T Sensitizer | | | 0.05 g |
| Diphenyliodonium+ PF6− Initiator | 0.4 g | 0.4 g | 0.4 g |

The solutions were coated onto 75 μm polyester sheets using a #10 Meyer bar (wire wound rod) and dried at 150° F. (66° C.) for 2 minutes to make Samples 1–3 respectively.

Elvacite® 2010 is a poly(methylmethacrylate) binder available from E. I. DuPont Co., Wilmington, Del.

The sensitizer used and referred to herein as "Coumarin" or "Keto-coumarin" is 3,3′-carbonylbis(7-diethylamino)coumarin [CAS#63226-13-1]. It has the following structure:

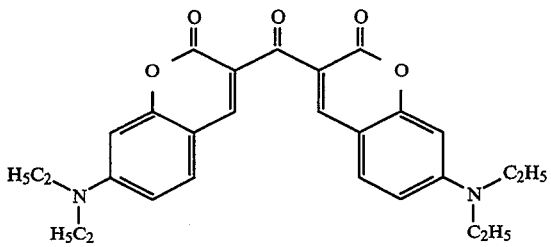

The sensitizer used and referred to herein as "DMBA" is 1,5-bis[4-(dimethylamino)phenyl]-1,4-pentadiene-3-one [CAS#6673-14-9]. It has the following structure:

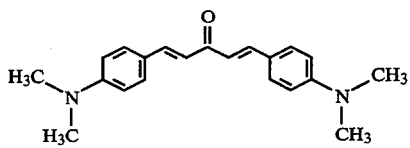

The sensitizer used and referred to herein as Thioflavin-T is also known as Basic Yellow 1 [CAS#2390-54-71 and has a Color Index No 49005. It has the following structure:

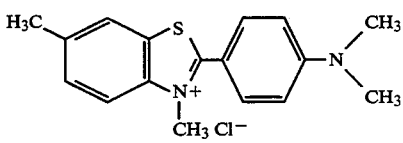

Samples were prepared from each coating of Examples 1–3 and their bleaching evaluated with different combinations of heat and light. "Heat only" treatment consisted of heating the sample at 190° F. (88° C.) for a specified time (see Table I below). "Light only" treatment consisted of exposing the sample for the specified time at about one joule per square centimeter per minute (1500 watt diazo mercury bulb at a distance of about 0.5 meter in a NuArc exposure unit). "Light and heat" treatment consisted of simultaneous heating and light exposure using the conditions used above for "heat only" and "light only." To show the effect of combined, but not simultaneous heating and light exposure, the samples were heated and then light-exposed, as well as light-exposed and then heated.

Table I shows the delta E (ΔE) values calculated from L* a* b* measured by a Macbeth Color-Eye Spectrophotometer according to the CIE 1976 color space standard. As the dye is destroyed, delta E (ΔE) increases, indicating bleaching and destruction of the sensitizing dye. As the data in Table I show, heat alone has little effect in changing delta E. Light alone has a small, but somewhat greater effect. The simultaneously light-exposed and heated material unexpectedly shows a much greater effect, especially at the short exposure times of form 1 to 2 minutes. Furthermore, the data also shows that either light followed by heat, or heat followed by light, do not achieve the same change in delta E as the simultaneous light-heat exposure.

TABLE I

DELTA E (ΔE) VALUES

| | | DURATION IN MINUTES | | | | | |
|---|---|---|---|---|---|---|---|
| | | 0 | 1 | 2 | 4 | 8 | 16 |
| EXAMPLE 1 | | | | | | | |
| Sample # | | | | | | | |
| 1 | Heat at 190° F. (88° C.) only | 0 | 0.14 | 0.11 | 0.16 | 0.18 | 0.09 |
| 2 | Light Only | 0 | 2.95 | 4.92 | 8.49 | 12.23 | 15.33 |
| 3 | Heat & Light Combined | 0 | 12.53 | 15.29 | 17.84 | 19.45 | 20.60 |
| 4 | Heat (2 min.) followed by Light | 0 | | 6.57 | | | |
| 5 | Light (2 min.) followed by Heat | 0 | | 5.87 | | | |
| EXAMPLE 2 | | | | | | | |
| Sample # | | | | | | | |
| 1 | Heat at 190° F. only | 0 | 0.41 | 0.49 | 0.50 | 0.55 | 0.59 |
| 2 | Light only | 0 | 11.07 | 13.62 | 15.60 | 16.63 | 17.23 |
| 3 | Heat & Light Combined | 0 | 15.01 | 16.15 | 16.87 | 17.55 | 17.99 |
| 4 | Heat (2 min.) followed by Light | 0 | | 14.53 | | | |
| 5 | Light (2 min.) followed by Heat | 0 | | 10.6 | | | |
| EXAMPLE 3 | | | | | | | |
| Sample # | | | | | | | |
| 1 | Heat at 190° F. only | 0 | 0.4 | 0.4 | 0.4 | 0.4 | 0.4 |
| 2 | Light only | 0 | 1.82 | 3.08 | 4.92 | 6.23 | 7.23 |
| 3 | Heat & Light Combined | 0 | 3.40 | 4.83 | 6.15 | 9.51 | 10.28 |

Examples 4–7

Examples 4–7 demonstrate the use of the bleaching process of the invention in an actual proofing system. In these examples, constructions, imagewise exposure, subtractive development process, and lamination are similar to those described in U.S. Pat. Nos. 4,710,445 and 4,746,595, the disclosures of which are incorporated herein by reference. In these examples, the photobleaching properties of two sensitizing dyes, "DMBA", and "Coumarin", were evaluated. Both of these dyes are included in the dye groups described in U.S. Pat. No. 3,729,313.

A polyurea subbing layer was prepared as shown below. The binder (ethyl cellulose) was dissolved first, and the remaining ingredients were then added in the order shown below (all parts are by weight):

| Material | Parts |
| --- | --- |
| Ethyl cellulose (N22, Hercules) | 40 |
| 1,1,2-trichloroethane | 1,800 |
| dodecyldiisocyanate (DDI-1410, Henkel) | 180 |
| polyamine-silane (A-1130, Union Carbide) | 20 |
| dibutyltin dilaurate | 10 |

This solution was coated onto unprimed 2 mil (50.8 μm) poly(ethyleneterphthalate) film to provide a subbing layer with a dry coating weight of 150 mg/m$^2$.

The following photosensitive coating solutions were made by mixing (all parts are by weight):

| | Parts | |
| --- | --- | --- |
| Material | Examples 4–5 | Examples 6–7 |
| 2-methyl-4-pentanone | 350 | 700 |
| pentaerythritol tetraacrylate (SR-295) | 130 | 87 |
| cyclohexanone | 600 | 40 |
| magenta pigment dispersion | 1,100 | |
| cyan pigment dispersion | | 500 |
| Oligomer as described in U.S. Pat. No. 4,228,232; Preparation No. P-II and Example 1 | 84 | 56 |
| polyketone resin (Lawter 1717-B) | 96 | 64 |
| polycaprolactone resin (Tone-201) | 20 | 13 |
| diphenyliodonium$^+$ PF$_6^-$ initiator | 30 | 20 |
| triethylamine | 2 | 2 |
| FC-430 coating aid | 0.05 | 0.05 |
| sensitizing dye (DMBA or Coumarin) | 6 | 2.5 |

The pigment dispersions were 10 wt % of pigment, 1.5% Butvar TM B-76, and cyclohexanone. The dispersion was made in a sand mill. The magenta pigment used in Examples 4 and 5 was Watthung Red RT 698-D, available from Heubach Chemical Co., Newark, N.J. The cyan pigment used in Examples 6 and 7 was Sun Blue 1282, available from Sun Chemical, Cincinnati, Ohio.

Butvar TM B-76 is a poly(vinylbutyral) resin available from Monsanto Chemical Co., St. Louis, Mo. SR-295 is a pentaerythritol tetraacrylate available from Sartomer Co., West Chester, Pa. Lawter 1717-B polyketone resin is believed to be the polymerization product of cyclohexanone and formaldehyde and is available from Lawter Chemical Co., Chicago, Ill. ICI 382-ES is believed to be a bisphenol-A polyester resin available from ICI. Tone 201 is believed to be a polycaprolactone resin available from Union Carbide. FC-430 is believed to be a coating aid available from 3M Company, St. Paul, Minn.

This photosensitive solution was coated onto the subbed polyester and dried in an oven for 1 minute at 70° C. The dried coating was overcoated with a polyvinylalcohol topcoat at a coating weight of 70 mg/ft$^2$ (753 mg/m$^2$) by using an aqueous solution of 5% Monsanto Gelvatol 20-30 poly(vinylalcohol). The aqueous solution also contained 0.05% by weight of Rohm & Haas X-200 wetting agent.

The dried photosensitive film was contact imaged through a photographic negative, developed in an aqueous alkaline solution containing 1.5% by weight sodium hydroxide and 0.2% of Rohm & Haas X-100 wetting agent, and air dried. Rohm & Haas X-100 is believed to be nonylphenol ethylene oxide adduct non-ionic surfactant wetting agent. The image developed with good resolution.

A thermal adhesive coated paper was prepared by mixing the materials shown below (all parts are by weight), coating them onto 3M Matchprint TM Commercial Negative proofing paper, and drying. A dry coating weight of 1 g/ft$^2$ (10.8 g/m$^2$) was achieved.

| Material | Parts |
| --- | --- |
| 2-butanone | 110 |
| Shell Epon TM 1004 EF resin | 12 |
| ICI Bisphenol-A polyester resin (382-ES) | 48 |
| Union Carbide polycaprolactone resin (Tone 201) | 9 |
| cyclohexanone | 50 |
| diphenyliodonium$^+$ PF$_6^-$ initiator | 5 |

Shell Epon TM 1004 EF resin is believed to be Bisphenol-A epoxy resin available from Shell Chemical Co., Houston, Tex.

The developed film was placed image side in contact with the thermal adhesive on the paper and laminated using the heated rolls of a 3M Model 447 Proofing Laminator. The roll set temperatures were 240° F. (116° C.) for the top roll and 150° F. (66° C.) for the bottom roll. The laminating speed was 20 in/min (50.8 cm/min).

Five samples were taken from each of the four experimental coatings. One sample was kept as a control and was neither heated nor irradiated and its L*a*b* values were measured. A second sample was irradiated with light at room temperature to determine the amount of sensitizer bleached. A third sample was irradiated with light while being heated at 190° F. (88° C.) for 2 minutes to determine the amount of sensitizer bleached. A fourth sample was irradiated with light while being heated at 190° F. (88° C.) for 4 minutes to determine the amount of sensitizer bleached. L*a*b* values for each of the other samples were measured after treatment. A fifth sample was heated at 88° C. for two minutes without irradiation with light. No substantial bleaching was observed in any of the experimental coatings. Irradiation was carried out using a 1500 watt "diazo" bulb in a NuArc exposure unit (available from NuArc, Niles, Ill.) which was located over a heatable platen. The exposure fluence was about 1 Joule/cm$^2$.

Table II compares the L*a*b* values for each of Examples 4–7. Because the dyes are yellow, the b* values are the most important. The data compares the samples with no post exposure, samples with a two-minute post exposure at room temperature (i.e., no heat), samples with a two-minute post exposure while at 190° F. (88° C.), and a four-minute post exposure while the sample was at 190° F. (88° C.). In all cases, the sample that had been irradiated and heated for 4 minutes was considered fully bleached. The difference in b* between the control sample and those that had been irradiated and/or heated for various periods of time was measured and is given as Δb*.

The data of these examples demonstrates that the most complete bleaching of the sensitizing dye (i.e., the largest value of Δb*) occurs when post exposure irradiation is combined with heating.

TABLE II

| Example Number | Control No Light Exposure No Heat | 2 min Light Exposure No Heat | 2 min Light Exposure + 2 min Heat at 88° C. | 4 min Light Exposure + 4 min Heat at 88° C. |
| --- | --- | --- | --- | --- |
| Example 4: Magenta Pigment with "DMBA" Sensitizer | | | | |
| L* | 51.15 | 51.02 | 51.12 | 51.27 |
| a* | 60.63 | 60.49 | 60.42 | 60.20 |
| b* | 16.37 | 4.06 | 1.71 | 1.08 |
| Δb* | 0.00 | 12.31 | 14.66 | 15.29 |
| Example 5: Magenta Pigment with "Coumarin" Sensitizer | | | | |
| L* | 49.58 | 49.69 | 49.87 | 50.30 |
| a* | 60.04 | 60.14 | 59.56 | 59.41 |
| b* | 21.93 | 14.35 | 6.19 | 4.42 |
| Δb* | 0.00 | 7.58 | 15.74 | 17.51 |
| Example 6: Cyan Pigment with "DMBA" Sensitizer | | | | |
| L* | 53.74 | 55.98 | 56.56 | 56.67 |
| a* | −43.95 | −39.49 | −38.26 | −38.20 |
| b* | −21.93 | −38.02 | −39.89 | −40.06 |
| Δb* | 0.00 | 16.09 | 17.96 | 18.13 |
| Example 7: Cyan Pigment with "Coumarin" Sensitizer | | | | |
| L* | 55.43 | 56.56 | 57.12 | 57.22 |
| a* | −47.90 | −43.77 | −39.27 | −38.96 |
| b* | −18.89 | −30.28 | −39.24 | −39.78 |
| Δb* | 0.00 | 11.39 | 20.35 | 20.89 |

Reasonable modifications and variations are possible from the foregoing disclosure without departing from either the spirit or scope of the present invention as defined by the claims.

We claim:

1. A process for producing an imaged article with little residual dye stain and having a stable color image consisting essentially of the steps of:
   (a) exposing a negative-acting photoresist to radiation having a wavelength in the range of from about 300 to 1100 nm, said photoresist consisting essentially of:
      (i) free-radically polymerizable monomer containing an acrylate or methacrylate group, and
      (ii) a sensitizing dye selected from the group consisting of: coumarin, aminoketone, and thiazole dyes in reactive association with an aromatic iodonium salt or halogenated triazine compound, thereby forming an image in the exposed or unexposed areas of the photoresist;
   (b) subtractively developing said image resulting from step (a); and
   (c) bleaching the remaining sensitizing dye in said photoresist by simultaneously heating and exposing said sensitizing dye and aromatic iodonium salt or halogenated triazine compound to radiation having a wavelength in the range of about 300 to about 700 nm at a temperature of at least about 40° C.

2. The process according to claim 1 wherein said radiation in step (a) has a wavelength in the range of from about 300 to 800 nm.

3. The process according to claim 1 wherein said aromatic iodonium salt is selected from the group consisting of:

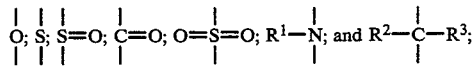

wherein:

$Ar^1$ and $Ar^2$ are aromatic groups having from 4 to 20 carbon atoms;

W is selected from the group consisting of: a single bond;

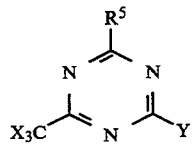

$R^1$ is aryl of 6 to 20 carbon atoms and $R^2$ and $R^3$ are individually hydrogen or alkyl groups of 1 to 4 carbon atoms; and $Q^-$ is an anion.

4. The process according to claim 1 wherein said halogenated triazine is represented by the following formula:

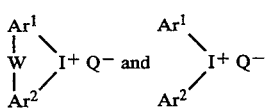

wherein:

X is chlorine or bromine;

Y is $-CX_3$; $-NH_2$; $-NHR^4$; $-N(R^4)_2$; or $-OR^4$ wherein $R^4$ is an alkyl group of 1 to 4 carbon atoms or an aryl group of 6 to 10 carbon atoms; and $R^5$ is $-CX_3$; an alkyl group of 1 to 12 carbon atoms; an aryl group of 6 to 12 carbon atoms; an alkenyl group of 2 to 12 carbon atoms; or an aralkenyl group of 8 to 20 carbon atoms.

5. The process according to claim 1 wherein the weight ratio of said sensitizing dye to said aromatic iodonium salt or triazine compound in step (a) is in the range of about 1:1 to 1:50.

6. The process according to claim 5 wherein the weight ratio of said sensitizing dye to said aromatic iodonium salt or triazine compound in step (a) is in the range of about 1:2 to 1:10.

7. The process according to claim 1 wherein said radiation in step (c) has a wavelength in the range of about 300–500 nm and said heating is conducted at a temperature in the range of about 40° to 150° C. for about 0.5 to 10 minutes.

8. The process according to claim 7 wherein said heating is conducted at a temperature in the range of about 60° to 100° C. for about 1 to 3 minutes.

9. The process according to claim 1 wherein the radiation exposure fluence in step (c) is in the range of about 0.5 to 1.0 J/cm².

10. The process according to claim 1 wherein the radiation exposure fluence in step (c) is about 1 J/cm².

11. A process for producing an imaged article with little dye stain and having a stable color dye image consisting essentially of the steps of:
   (a) exposing a negative-acting photoresist to radiation having a wavelength in the range of about 300 to 1100 nm, the photoresist consisting essentially of:
      (i) free-radically polymerizable monomer containing an acrylate or methacrylate group; and
      (ii) a sensitizing dye selected from the group consisting of: coumarin, aminoketone, and thiazole dyes in reactive association with an aromatic iodonium salt or a halogenated triazine compound,
   thereby forming an image in the exposed or unexposed areas of the photoresist;
   (b) subtractively developing the image resulting from step (a);
   (c) bringing the remaining sensitizing dye in the photoresist from step (b) into reactive association with additional aromatic iodonium salt or halogenated triazine compound; and
   (d) bleaching the remaining sensitizing dye in the photoresist by simultaneously heating and exposing the sensitizing dye and aromatic iodium salt or halogenated triazine compound to radiation having a wavelength in the range of from about 300 to 700 nm at a temperature of at least about 40° C.

12. The process according to claim 11 wherein said radiation in step (a) has a wavelength in the range of from about 300 to 800 nm.

13. The process according to claim 11 wherein said aromatic iodonium salt is selected from the group consisting of:

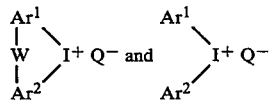

wherein:
Ar¹ and Ar² are aromatic groups having from 4 to 20 carbon atoms;
W is selected from the group consisting of: a single bond;

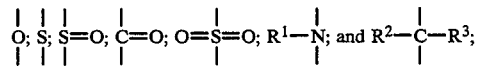

R¹ is aryl of 6 to 20 carbon atoms and R² and R³ are individually hydrogen or alkyl groups of 1 to 4 carbon atoms; and Q⁻ is an anion.

14. The process according to claim 11 wherein said halogenated triazine is represented by the following formula:

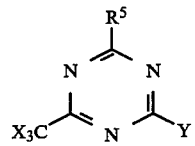

wherein:
X is chlorine or bromine;
Y is —CX₃; —NH₂; —NHR⁴; —N(R⁴)₂; or —OR⁴ wherein R⁴ is an alkyl group of 1 to 4 carbon atoms or an aryl group of 6 to 10 carbon atoms; and
R⁵ is —CX₃; an alkyl group of 1 to 12 carbon atoms; an aryl group of 6 to 12 carbon atoms; an alkenyl group of 2 to 12 carbon atoms; or an aralkenyl group of 8 to 20 carbon atoms.

15. The process according to claim 11 wherein the weight ratio of said sensitizing dye to said aromatic iodonium salt or triazine compound in step (a) is in the range of about 1:1 to 1:50.

16. The process according to claim 15 wherein the weight ratio of said sensitizing dye to said aromatic iodonium salt or triazine compound in step (a) is in the range of about 1:2 to 1:10.

17. The process according to claim 11 wherein said radiation in step (d) has a wavelength in the range of about 300–500 nm and said heating is conducted at a temperature in the range of about 40° to 150° C. for about 0.5 to 10 minutes.

18. The process according to claim 17 wherein said heating is conducted at a temperature in the range of about 60° to 100° C. for about 1 to 3 minutes.

19. The process according to claim 11 wherein the radiation exposure fluence in step (d) is in the range of about 0.5 to 1.0 J/cm².

20. The process according to claim 11 wherein the radiation exposure fluence in step (d) is about 1 J/cm².

21. The process according to claim 11 wherein step (c) is conducted simultaneously with step (d).

22. The process according to claim 11 wherein the molar concentration of said aromatic iodonium salt or said halogenated triazine compound to said sensitizing dye is at least about 1:1.

* * * * *